US010784418B2

(12) United States Patent
Yoo et al.

(10) Patent No.: US 10,784,418 B2
(45) Date of Patent: Sep. 22, 2020

(54) VERTICAL TYPE LIGHT EMITTING ELEMENT HAVING COLOR CONVERSION ELECTRODE PART

(71) Applicant: LUMENS CO., LTD., Yongin-si, Gyeonggi-do (KR)

(72) Inventors: Taekyung Yoo, Yongin-si (KR); Daewon Kim, Yongin-si (KR)

(73) Assignee: LUMENS CO., LTD., Yongin-si (KR)

(*) Notice: Subject to any disclaimer, the term of this patent is extended or adjusted under 35 U.S.C. 154(b) by 24 days.

(21) Appl. No.: 16/126,973

(22) Filed: Sep. 10, 2018

(65) Prior Publication Data

US 2019/0097100 A1    Mar. 28, 2019

(30) Foreign Application Priority Data

Sep. 22, 2017   (KR) .................. 10-2017-0122790

(51) Int. Cl.
| H01L 33/50 | (2010.01) |
| H01L 25/075 | (2006.01) |
| H01L 33/22 | (2010.01) |
| H01L 33/40 | (2010.01) |
| H01L 33/58 | (2010.01) |
| H01L 33/46 | (2010.01) |
| H01L 33/06 | (2010.01) |
| H01L 33/32 | (2010.01) |
| H01L 33/00 | (2010.01) |

(52) U.S. Cl.
CPC ........ *H01L 33/505* (2013.01); *H01L 25/0753* (2013.01); *H01L 33/22* (2013.01); *H01L 33/405* (2013.01); *H01L 33/46* (2013.01); *H01L 33/58* (2013.01); *H01L 33/007* (2013.01); *H01L 33/0093* (2020.05); *H01L 33/06* (2013.01); *H01L 33/32* (2013.01)

(58) Field of Classification Search
None
See application file for complete search history.

(56) References Cited

U.S. PATENT DOCUMENTS 6,670,772 B1 * 12/2003 Arnold ................ H01L 27/3258
                                              313/504
7,057,339 B2 * 6/2006 Boroson ................ H01L 27/322
                                              313/110

(Continued)

*Primary Examiner* — David E Graybill
(74) *Attorney, Agent, or Firm* — Mei & Mark LLP

(57) ABSTRACT

A vertical type light emitting element is disclosed. The vertical type light emitting element includes: a color conversion electrode part including a first electrode pad and a color conversion layer; a reflective electrode part including a second electrode pad and a reflective layer; and a light emitting semiconductor part interposed between the color conversion electrode part and the reflective electrode part. The color conversion electrode part further includes an electrically conductive light transmissive plate. The first electrode pad and the color conversion layer are interposed between the light transmissive plate and the upper surface of the light emitting semiconductor part. Roughnesses are formed on the upper surface of the light emitting semiconductor part bordering the color conversion electrode part to increase the amount of light entering the color conversion electrode part through the light emitting semiconductor part.

16 Claims, 3 Drawing Sheets

(56) References Cited

U.S. PATENT DOCUMENTS

| | | | | |
|---|---|---|---|---|
| 7,812,359 B2* | 10/2010 | Lee | ............... | H01L 27/322 257/98 |
| 8,044,575 B2* | 10/2011 | Kawamura | ............ | H01L 27/322 313/504 |
| 9,054,270 B2* | 6/2015 | Hung | ............... | H01L 33/22 |
| 9,490,455 B2* | 11/2016 | Fogel | ............... | H01L 51/5275 |
| 2005/0062407 A1* | 3/2005 | Suh | ............... | H01L 27/322 313/504 |
| 2006/0012288 A1* | 1/2006 | Terakado | ............ | H01L 27/322 313/503 |
| 2006/0158403 A1* | 7/2006 | Kuma | ............ | H01L 51/5036 345/83 |
| 2006/0284533 A1* | 12/2006 | Lee | ............... | H01L 27/322 313/112 |
| 2009/0166645 A1* | 7/2009 | Lee | ............... | H01L 27/153 257/87 |
| 2010/0213474 A1* | 8/2010 | Hsu | ............... | H01L 27/156 257/89 |
| 2010/0214511 A1* | 8/2010 | Hsu | ............... | G02F 1/133603 349/68 |
| 2011/0062859 A1* | 3/2011 | Kawamura | ............ | H01L 27/322 313/504 |
| 2011/0272666 A1* | 11/2011 | Hung | ............... | H01L 33/22 257/13 |
| 2012/0003766 A1* | 1/2012 | Lee | ............... | H01L 27/153 438/29 |
| 2013/0222731 A1* | 8/2013 | Hsu | ............... | H01L 27/156 349/62 |
| 2013/0280835 A1* | 10/2013 | Hung | ............... | H01L 33/22 438/27 |
| 2015/0076451 A1* | 3/2015 | Dobbertin | ............ | H01L 51/504 257/40 |
| 2015/0115278 A1* | 4/2015 | Ichikawa | ............ | H01L 33/22 257/76 |
| 2016/0049444 A1* | 2/2016 | Hsu | ............... | H01L 27/156 257/89 |
| 2016/0240755 A1* | 8/2016 | Stockman | ............ | H01L 33/502 |
| 2016/0276524 A1* | 9/2016 | Fogel | ............... | H01L 33/0095 |
| 2016/0276628 A1* | 9/2016 | Fogel | ............... | H01L 51/5275 |
| 2017/0162816 A1* | 6/2017 | Kim | ............... | H01L 51/5088 |
| 2019/0165318 A1* | 5/2019 | Choi | ............... | H01L 51/5268 |
| 2019/0229236 A1* | 7/2019 | Chou | ............... | H01L 33/32 |
| 2020/0013761 A1* | 1/2020 | Chaji | ............... | H01L 33/62 |

* cited by examiner

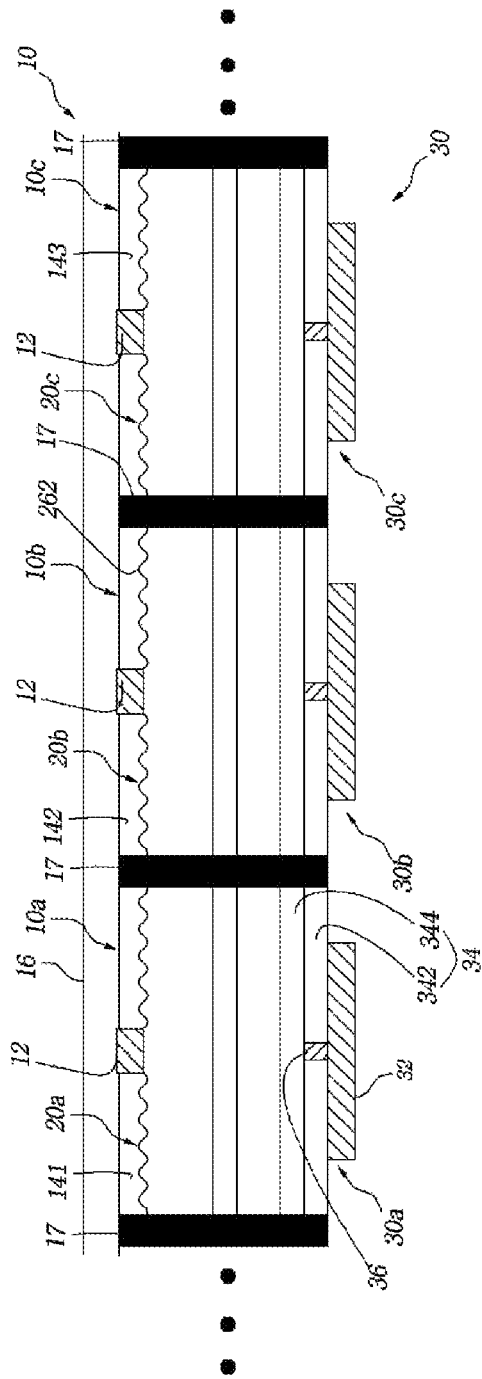

VERTICAL TYPE LIGHT EMITTING ELEMENT HAVING COLOR CONVERSION ELECTRODE PART

BACKGROUND OF THE INVENTION

1. Field of the Invention

The present invention relates to a vertical type light emitting element, and more specifically to a vertical type light emitting element having a color conversion electrode part that is suitable for use in a full-color LED display.

2. Description of the Related Art

A typical full-color LED display includes pixels, each of which consists of red, green, and blue LEDs. In recent years, LED displays have been proposed wherein each pixel consists of red, green, blue, and white LEDs.

Package-on-module and chip-on-module have been developed as techniques to achieve RGB emission for the fabrication of LED displays. According to the package-on-module technique, blue, green, and red LED packages are modularized and the modules are applied to LED displays. However, this technique is difficult to apply to the fabrication of small-sized displays and has difficulty in increasing the resolution of displays. According to the chip-on-module technique, blue, green, and red LED chips are not loaded in a package but are directly mounted on a substrate to construct modules. The chip-on-module technique enables the miniaturization of displays and is thus advantageous in terms of display resolution and color gamut compared to the package-on-module technique.

However, conventional blue, green, and red LED chips are limited to lateral chip or flip-chip structures that require both top and bottom electrodes, which limits their miniaturization. Since some regions of an LED chip having a lateral chip or flip-chip structure are removed by mesa etching, the area of the active layer where light is actually generated is reduced, resulting in a reduction in light emitting area relative to the area of the chip. This becomes a cause that makes the flip-chip type or lateral type LED chip difficult to apply to a micro-LED display. Further, in the case where the flip-chip type LED chip is applied to a micro-LED display, scattering is likely to occur due to the thickness of a sapphire substrate, causing a reduction in light extraction efficiency. The application of the conventional LED chip to a micro-LED display requires the formation of a color conversion layer including a fluorescent material on a sapphire substrate through which light is emitted. In this case, a difference is observed in the color conversion of light between a region directly on the active layer and a region where the active layer is not present.

SUMMARY OF THE INVENTION

Therefore, the present invention has been made in an effort to solve the problems of the prior art, and it is an object of the present invention to provide a vertical type light emitting element in which a color conversion electrode part capable of performing the functions of both electrode and color converter is formed on the upper surface of a light emitting semiconductor part having roughnesses, achieving improved light extraction efficiency and color conversion efficiency and high color uniformity of light converted into a specific color.

A vertical type light emitting element according to one aspect of the present invention includes: a color conversion electrode part including a first electrode pad and a color conversion layer; a reflective electrode part including a second electrode pad and a reflective layer; and a light emitting semiconductor part interposed between the color conversion electrode part and the reflective electrode part, wherein the color conversion electrode part further includes an electrically conductive light transmissive plate, the first electrode pad and the color conversion layer are interposed between the light transmissive plate and the upper surface of the light emitting semiconductor part, and roughnesses are formed on the upper surface of the light emitting semiconductor part to increase the amount of light entering the color conversion electrode part through the light emitting semiconductor part.

According to one embodiment, the light emitting semiconductor part includes at least one vertical light emitting cell including a first conductive semiconductor layer electrically connected to the first electrode pad and a second conductive semiconductor layer electrically connected to the second electrode pad.

According to one embodiment, the roughnesses are formed when a sapphire substrate is removed.

According to one embodiment, the roughnesses are formed by etching a surface remaining after a sapphire substrate is removed.

According to one embodiment, the light transmissive plate is at least sectionwise electrically conductive, and the first electrode pad and the color conversion layer are interposed between the light transmissive plate and the upper surface of the light emitting semiconductor part.

According to one embodiment, the first electrode pad extends vertically from the upper surface of the light emitting semiconductor part and is electrically connected to the light transmissive plate across the color conversion layer.

According to one embodiment, the light transmissive plate includes indium tin oxide (ITO).

According to one embodiment, the light transmissive plate is produced by forming a conductive pattern on the bottom surface of a non-conductive light transmissive plate.

According to one embodiment, the first electrode pad penetrates the color conversion layer and protrudes beyond the upper surface of the color conversion layer.

According to one embodiment, the color conversion layer includes a red light emitting region receiving light from the light emitting semiconductor part to emit red light, a green light emitting region receiving light from the light emitting semiconductor part to emit green light, and a blue light emitting region receiving light from the light emitting semiconductor part to emit blue light; and the red light emitting region, the green light emitting region, and the blue light emitting region are arranged in parallel with one another along the upper surface of the light emitting semiconductor part.

According to one embodiment, the color conversion layer includes a red light emitting region and a green light emitting region stacked in a direction perpendicular to the upper surface of the light emitting semiconductor part, the red light emitting region converts the wavelength of blue light or UV light emitted from the light emitting semiconductor part into red light, and the green light emitting region converts the wavelength of blue light or UV light emitted from the light emitting semiconductor part into green light.

According to one embodiment, the reflective layer is formed on the lower surface of the second conductive semiconductor layer, and the second electrode pad is formed on the lower surface of the reflective layer and is electrically connected to the second conductive semiconductor layer.

According to one embodiment, the reflective layer includes a metal reflective layer and a DBR layer.

According to one embodiment, the reflective layer includes a metal reflective layer connected to the second conductive semiconductor layer, an electrically insulating layer formed on the lower surface of the metal reflective layer, and a via connecting the metal reflective layer to the second electrode pad across the electrically insulating layer.

According to one embodiment, the light emitting semiconductor part includes a first vertical light emitting cell, a second vertical light emitting cell, and a third vertical light emitting cell spaced apart from one another; the color conversion electrode part includes a first color conversion electrode cell formed on the upper surface of the first vertical light emitting cell, a second color conversion electrode cell formed on the upper surface of the second vertical light emitting cell, and a third color conversion electrode cell formed on the upper surface of the third vertical light emitting cell; and the reflective electrode part includes a first reflective electrode cell formed on the lower surface of the first vertical light emitting cell, a second reflective electrode cell formed on the lower surface of the second vertical light emitting cell, and a third reflective electrode cell formed on the lower surface of the third vertical light emitting cell.

According to one embodiment, the first color conversion electrode cell includes a red light emitting region receiving blue light or UV light to emit red light, the second color conversion electrode cell includes a green light emitting region receiving blue light or UV light to emit green light, and the third color conversion electrode cell includes a blue light emitting region receiving blue light or UV light to emit blue light.

According to one embodiment, a light absorber is filled between the first color conversion electrode cell and the second color conversion electrode cell and between the second color conversion electrode cell and the third color conversion electrode cell.

According to one embodiment, the light transmissive plate is electrically connected individually or in common to first electrode pads disposed in the first color conversion electrode cell, the second color conversion electrode cell, and the third color conversion electrode cell while being in contact with the first color conversion electrode cell, the second color conversion electrode cell, and the third color conversion electrode cell.

BRIEF DESCRIPTION OF THE DRAWINGS

These and/or other aspects and advantages of the invention will become apparent and more readily appreciated from the following description of the embodiments, taken in conjunction with the accompanying drawings of which:

FIG. 4 is a cross-sectional view illustrating a vertical type light emitting element having a color conversion electrode part according to a fourth embodiment of the present invention.

DETAILED DESCRIPTION OF THE INVENTION

Figure 1:
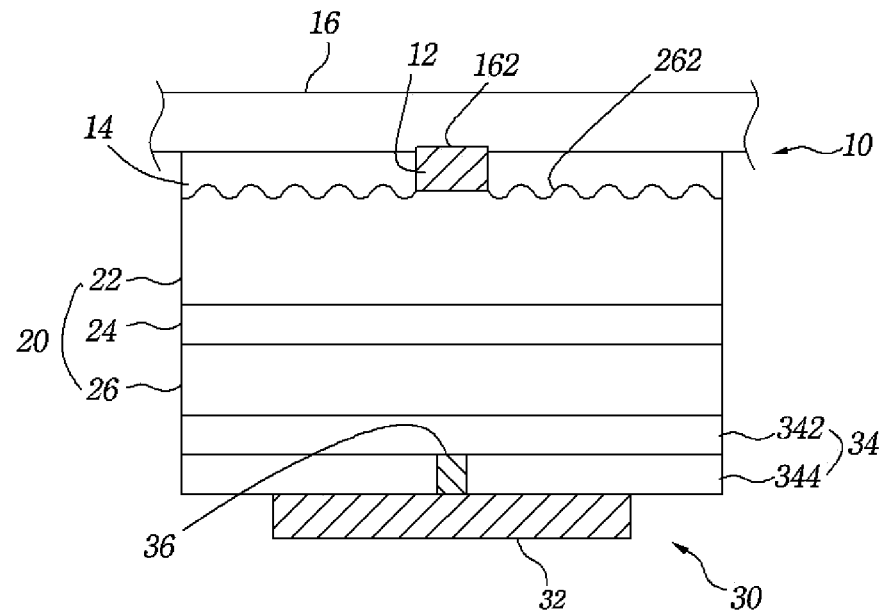
FIG. 1 is a cross-sectional view illustrating a vertical type light emitting element having a color conversion electrode part according to a first embodiment of the present invention.

Preferred embodiments of the present invention will now be described with reference to the accompanying drawings. These embodiments are provided so that this disclosure will be thorough and complete, and will fully convey the scope of the invention to those skilled in the art. Accordingly, the present invention may be embodied in many different forms and should not be construed as limited to the exemplary embodiments set forth herein. In the drawings, the dimensions, such as widths, lengths and thicknesses, of elements may be exaggerated for clarity.

FIG. 1 is a cross-sectional view illustrating a vertical type light emitting element having a color conversion electrode part according to a first embodiment of the present invention.

Referring to FIG. 1, the vertical type light emitting element includes a color conversion electrode part 10, a reflective electrode part 30, and a light emitting semiconductor part 20 interposed between the color conversion electrode part 10 and the reflective electrode part 30. The color conversion electrode part 10 is located on the light emitting semiconductor part 20 and the reflective electrode part 30 is located under the light emitting semiconductor part 20.

The color conversion electrode part 10 includes a first electrode pad 12 and a color conversion layer 14 and the reflective electrode part 30 includes a second electrode pad 32 and a reflective layer 34, which will be described in detail below.

The light emitting semiconductor part 20 includes a light emitting cell consisting of gallium nitride epilayers grown on a sapphire substrate. The light emitting cell includes a first gallium nitride conductive semiconductor layer 22, a gallium nitride active layer 24 including multi-quantum wells (MQWs), and a second gallium nitride conductive semiconductor layer 26. Preferably, the first conductive semiconductor layer 22 is an n-type semiconductor layer and the second conductive semiconductor layer 26 is a p-type semiconductor layer. The light emitting cell may be a vertical type LED chip in which the areas of the first conductive semiconductor layer 22, the second conductive semiconductor layer 26, and the active layer 24 are almost the same, the first electrode pad 12 is connected to the first conductive semiconductor layer 22, and the second conductive electrode pad 32 extending in an opposite direction to the first electrode pad 12 is connected to the second conductive semiconductor layer 26.

The light emitting semiconductor part 20, namely, the light emitting cell, includes an upper surface formed when the sapphire substrate is removed from the first conductive semiconductor layer 22 or from a buffer layer interposed between the sapphire substrate and the first conductive semiconductor layer 22 to reduce lattice mismatch between them. Roughnesses are formed on the upper surface of the light emitting semiconductor part 20 bordering the color conversion electrode part 10 to increase the amount of light entering the color conversion electrode part 10 through the light emitting semiconductor part 20. The sapphire substrate may be removed by a suitable process, such as laser lift-off (LLO), and the reflective electrode part 30 may be used as means to support the light emitting semiconductor part 20 during removal of the sapphire substrate by laser lift-off.

The roughnesses formed on the upper surface of the light emitting semiconductor part 20 for the purpose of improving light extraction efficiency may remain when the sapphire substrate is removed. Alternatively, the roughnesses may be formed by etching (for example, PEC etching) the surface exposed after the sapphire substrate is removed from the first conductive semiconductor layer 22 or the buffer layer.

The color conversion electrode part 10 includes a sectionwise or entirely electrically conductive light transmissive plate 16. The light transmissive plate 16 may be a conductive light transmissive plate such as an indium tin oxide (ITO) plate or may be produced by forming an electrically conductive pattern on the bottom surface of a non-conductive light transmissive plate such as a glass plate. The first electrode pad 12 and the color conversion layer 14 are interposed between the light transmissive plate 16 and the upper surface of the light emitting semiconductor part 20.

The first electrode pad 12 extends vertically from the upper surface of the light emitting semiconductor part 20 on which the roughnesses are formed. The first electrode pad 12 is electrically connected to the light transmissive plate 16 across the color conversion layer 14. More preferably, the first electrode pad 12 extends vertically from the upper surface of the light emitting semiconductor part 20, penetrates the color conversion layer 14, and protrudes beyond the upper surface of the color conversion layer 14. The light transmissive plate 16 may include a recess 162 for electrical connection to accommodate the tip of the first electrode pad 12 protruding through the color conversion layer 14. The light transmissive plate 16 is in electrical contact with the first electrode pad 12 through the recess 162. As a result, the light transmissive plate 16 may be in close contact with both the upper surface of the color conversion layer 14 and the surface of the upper end of the first electrode pad 12 with no spacing.

The color conversion layer 14 may be formed using a resin including a wavelength converting material, for example, a fluorescent material. The color conversion layer 14 serves to convert light at a particular wavelength, preferably blue light or UV light, emitted from the light emitting semiconductor part 20 into light of different colors. As described in other embodiments that follow, the color conversion layer 14 converts light at a particular wavelength emitted from the light emitting semiconductor part 20 into light at various wavelengths or allows light at a particular wavelength emitted from the light emitting semiconductor part 20 to pass therethrough without wavelength conversion, making the light emitting element suitable for use in a full-color display version.

The portion of the light transmissive plate 16 connected to the first electrode pad 12 is at least electrically conductive, omitting bonding wires thereon while avoiding the use of flip-chip bonding.

According to this embodiment, the light emitting semiconductor part 20 is a vertical type light emitting cell structure that is formed without using mesa etching, which is essential for the fabrication of flip-chip type LEDs. Thus, the area of the active layer 24 where light is actually generated remains almost constant, resulting in large area and amount of light emission relative to the area of the element and high color uniformity of light emitted.

In this embodiment, the reflective layer 34 of the reflective electrode part 30 is formed on the lower surface of the second conductive semiconductor layer 26, and the second electrode pad 32 of the reflective electrode part 30 is formed on the lower surface of the reflective layer 34 and may be electrically connected to the second conductive semiconductor layer 26. The reflective layer 34 may include a metal reflective layer 342 connected to the second conductive semiconductor layer 26, an electrically insulating layer 344 formed on the lower surface of the metal reflective layer 342, and a via 36 electrically connecting the metal reflective layer 342 to the second electrode pad 32 across the electrically insulating layer 344. A DBR layer may also be used as the electrically insulating layer 344. In this case, interchange of the positions of the electrically insulating layer 344 and the metal reflective layer 342 may also be considered. The application of a via penetrating the metal reflective layer 342 may also be considered. In this case, an electrically insulating coating layer may be formed on the outer circumference of the conductive via. Depending on desired emission wavelengths, the reflective layer may use either the DBR layer or the metal reflective layer, the material for the metal reflective layer may be appropriately selected or the DBR layer may be appropriately selected.

Figure 2:
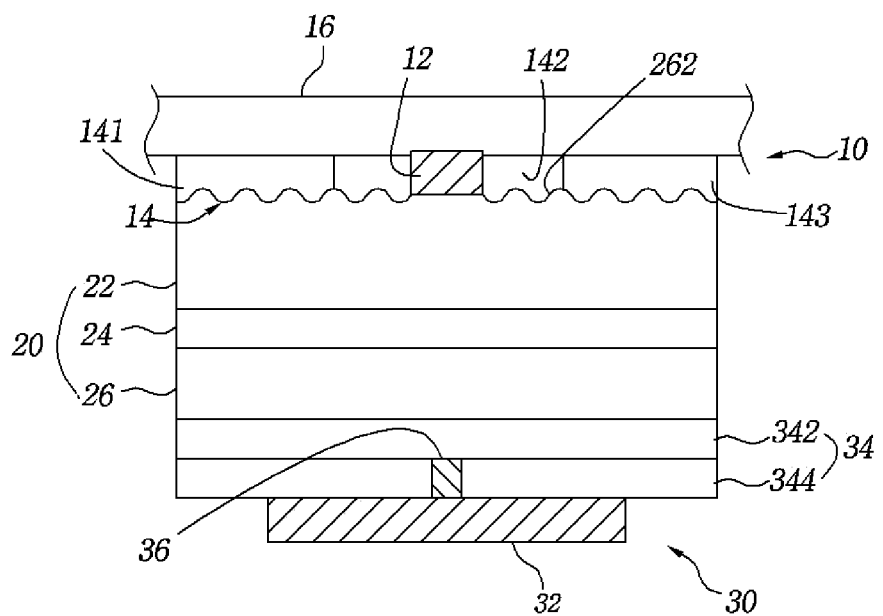
FIG. 2 is a cross-sectional view illustrating a vertical type light emitting element having a color conversion electrode part according to a second embodiment of the present invention.

FIG. 2 is a cross-sectional view illustrating a vertical type light emitting element having a color conversion electrode part according to a second embodiment of the present invention.

Referring to FIG. 2, a light emitting semiconductor part 20 has a single light emitting cell structure. As in the previous embodiment, the color conversion electrode part 10 is provided on the upper surface of the light emitting semiconductor part 20 and includes a first electrode pad 12 and a color conversion layer 14.

Unlike in the previous embodiment, the color conversion layer 14 includes a red light emitting region 141 receiving light from the light emitting semiconductor part 20 to emit red light, a green light emitting region 142 receiving light from the light emitting semiconductor part 20 to emit green light, and a blue light emitting region 143 receiving light from the light emitting semiconductor part 20 to emit blue light. In this embodiment, the red light emitting region 141, the green light emitting region 142, and the blue light emitting region 143 are arranged in parallel with one another along the upper surface of the light emitting semiconductor part 20. The first electrode pad 12 penetrates at least one of the red light emitting region 141, the green light emitting region 142, and the blue light emitting region 143 and is electrically connected to a light transmissive plate 16 covering the entire upper surface of the color conversion layer 14. The light emitting semiconductor part 20 may include a gallium nitride light emitting cell emitting blue light or UV light, the red light emitting region 141 may include a red fluorescent material converting the wavelength of blue light or UV light emitted from the light emitting semiconductor part 20 to emit red light, and the green light emitting region 142 may include a green fluorescent material converting the wavelength of blue light or UV light emitted from the light emitting semiconductor part 20 to emit green light. The blue light emitting region 132 may include a fluorescent material converting the wavelength of UV light emitted from the light emitting semiconductor part 20 to emit blue light. Alternatively, the blue light emitting region 132 may be designed to transmit received blue light without wavelength conversion.

The other components of the light emitting element are substantially the same as those described in the first embodiment and thus a description thereof is omitted to avoid duplication.

Figure 3:
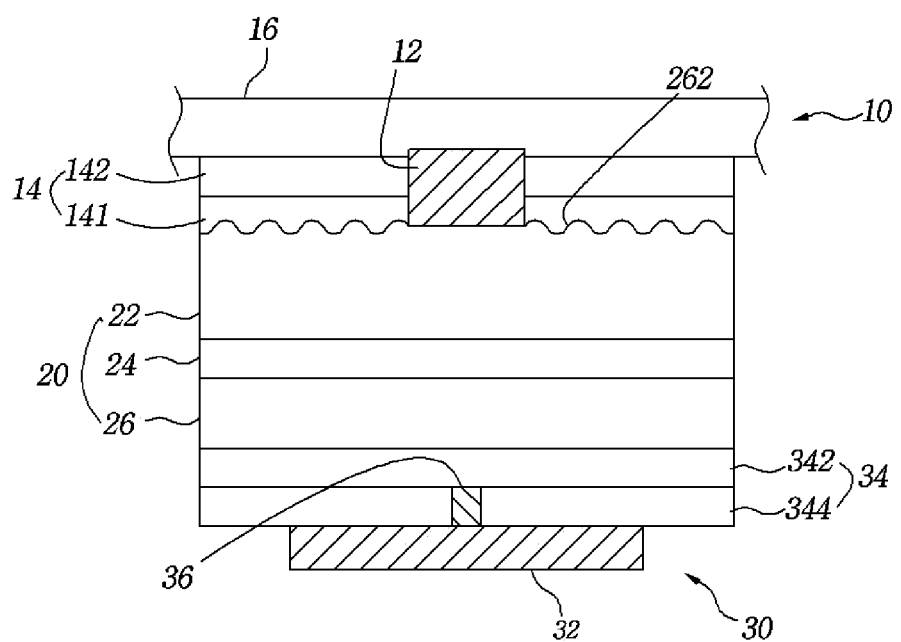
FIG. 3 is a cross-sectional view illustrating a vertical type light emitting element having a color conversion electrode part according to a third embodiment of the present invention.

FIG. 3 is a cross-sectional view illustrating a vertical type light emitting element having a color conversion electrode part according to a third embodiment of the present invention.

Referring to FIG. 3, a light emitting semiconductor part 20 has a single light emitting cell structure. As in the previous embodiments, the color conversion electrode part 10 is provided on the upper surface of the light emitting semiconductor part 20 and includes a first electrode pad 12 and a color conversion layer 14.

The color conversion layer 14 includes a red light emitting region 141 and a green light emitting region 142 stacked in a direction perpendicular to the upper surface of the light emitting semiconductor part 20. The red light emitting region 141 converts the wavelength of blue light or UV light emitted from the light emitting semiconductor part 20 into red light and the green light emitting region 142 converts the wavelength of blue light or UV light emitted from the light emitting semiconductor part 20 into green light.

The other components of the light emitting element are substantially the same as those described in the first and second embodiments and thus a description thereof is omitted to avoid duplication.

FIG. 4 is a cross-sectional view illustrating a vertical type light emitting element having a color conversion electrode part according to a fourth embodiment of the present invention.

Referring to FIG. 4, a light emitting semiconductor part 20 (see FIGS. 1 to 3) includes a first vertical light emitting cell 20a, a second vertical light emitting cell 20b, and a third vertical light emitting cell 20c spaced apart from one another. Each of the first vertical light emitting cell 20a, the second vertical light emitting cell 20b, and the third vertical light emitting cell 20c includes a first gallium nitride conductive semiconductor layer 22 (see FIGS. 1 to 3), a gallium nitride active layer 24 including multi-quantum wells (MQWs) (see FIGS. 1 to 3), and a second gallium nitride conductive semiconductor layer 26 (see FIGS. 1 to 3). Each of the first, second, and third vertical light emitting cells 20a, 20b, and 20c may be a vertical LED chip in which the areas of the first conductive semiconductor layer 22 (see FIGS. 1 to 3), the second conductive semiconductor layer 26 (see FIGS. 1 to 3), and the active layer 24 (see FIGS. 1 to 3) are almost the same, a first electrode pad 12 is connected to the first conductive semiconductor layer 22 (see FIGS. 1 to 3), and a second conductive electrode pad 26 extending in an opposite direction to the first electrode pad 12 is connected to the second conductive semiconductor layer 26 (see FIGS. 1 to 3).

Each of the first, second, and third vertical light emitting cells 20a, 20b, and 20c includes an upper surface formed when a sapphire substrate is removed from the first conductive semiconductor layer 22 (see FIGS. 1 to 3) or from a buffer layer interposed between the sapphire substrate and the first conductive semiconductor layer 22 (see FIGS. 1 to 3) to reduce lattice mismatch between them.

The color conversion electrode part 10 includes a first color conversion electrode cell 10a formed on the upper surface of the first vertical light emitting cell 20a, a second color conversion electrode cell 10b formed on the upper surface of the second vertical light emitting cell 20b, and a third color conversion electrode cell 10c formed on the upper surface of the third vertical light emitting cell 20c. A reflective electrode part 30 includes a first reflective electrode cell 30a formed on the lower surface of the first vertical light emitting cell 20a, a second reflective electrode cell 30b formed on the lower surface of the vertical light emitting cell 20b, and a third reflective electrode cell 30c formed on the lower surface of the third vertical light emitting cell 30c.

The upper surfaces of the first, second, and third vertical light emitting cells 20a, 20b, and 20c border the first, second, and third color conversion electrode cells 10a, 10b, and 10c, respectively. Roughnesses 262 are formed on the upper surfaces of the first, second, and third vertical light emitting cells 20a, 20b, and 20c to increase the amount of light entering the first, second, and third color conversion electrode cells 10a, 10b, and 10c through the first, second, and third vertical light emitting cells 20a, 20b, and 20c, respectively.

The first color conversion electrode cell 10a includes a red light emitting region 141 receiving blue or UV light to emit red light, the second color conversion electrode cell 10b includes a green light emitting region 142 receiving blue or UV light to emit green light, and the third color conversion electrode cell 10c includes a blue light emitting region 143 receiving blue or UV light to emit blue light. The blue light emitting region 143 of the third color conversion electrode cell 10c may emit received light without wavelength conversion. The blue light emitting region 143 of the third color conversion electrode cell 10c can transmit the received light therethrough without wavelength conversion.

A light absorber 17 is filled between the first color conversion electrode cell 10a and the second color conversion electrode cell 10b and between the second color conversion electrode cell 10b and the third color conversion electrode cell 10c to prevent interference between the colors of light emitted from the vertical light emitting cells. The light absorber 17 may be a black ink or resin. To further prevent color interference, the light absorber 17 is filled between the first vertical light emitting cell 20a and the second vertical light emitting cell 20b and between the second vertical light emitting cell 20b and the third vertical light emitting cell 20c.

The first vertical light emitting cell 20a, the first color conversion electrode cell 10a, and the first reflective electrode cell 30a constitute a first sub-pixel, the second vertical light emitting cell 20b, the second color conversion electrode cell 10b, and the second reflective electrode cell 30b constitute a second sub-pixel, and the third vertical light emitting cell 20c, the third color conversion electrode cell 10c, and the third reflective electrode cell 30c constitute a third sub-pixel when applied to an LED display. The first sub-pixel, the second sub-pixel, and the third sub-pixel are combined into one pixel. The light absorber 17 may also be filled between the pixel and other pixels adjacent thereto.

The color conversion electrode part 10 includes an at least sectionwise electrically conductive light transmissive plate 16. The light transmissive plate 16 is electrically connected individually or in common to first electrode pads 12 disposed in the first color conversion electrode cell 10a, the second color conversion electrode cell 10b, and the third color conversion electrode cell 10c while being in contact with the first color conversion electrode cell 10a, the second color conversion electrode cell 10b, and the third color conversion electrode cell 10c.

What is claimed is:
1. A vertical light emitting element comprising:
a color conversion electrode part comprising a first electrode pad and a color conversion layer, the color conversion layer comprising an upper surface and a lower surface opposite to the upper surface of the color conversion layer;

a reflective electrode part comprising a second electrode pad and a reflective layer, the reflective layer comprising an upper surface and a lower surface opposite to the upper surface of the reflective layer; and a light emitting semiconductor part interposed between the color conversion electrode part and the reflective electrode part, the light emitting semiconductor part comprising an upper surface and a lower surface opposite to the upper surface of the light emitting semiconductor part, wherein the color conversion electrode part further comprises an electrically conductive, light transmissive plate, wherein the first electrode pad and the color conversion layer are interposed between the light transmissive plate and the upper surface of the light emitting semiconductor part, wherein the upper surface of the light emitting semiconductor part is in direct contact with both the first electrode pad and the color conversion layer, and wherein roughnesses are formed on the upper surface of the light emitting semiconductor part.

2. The vertical light emitting element according to claim 1, wherein the light emitting semiconductor part comprises at least one vertical light emitting cell comprising a first conductive semiconductor layer electrically connected to the first electrode pad and a second conductive semiconductor layer electrically connected to the second electrode pad.

3. The vertical light emitting element according to claim 1, wherein the roughnesses are formed by removing a sapphire substrate from the first conductive semiconductor layer or a buffer layer formed on the first conductive semiconductor layer.

4. The vertical light emitting element according to claim 1, wherein the roughnesses are formed by etching a surface remaining after a sapphire substrate is removed from the first conductive semiconductor layer or a buffer layer formed on the first conductive semiconductor layer.

5. The vertical light emitting element according to claim 1, wherein the first electrode pad extends vertically from the upper surface of the light emitting semiconductor part and is electrically connected to the light transmissive plate across the color conversion layer.

6. The vertical light emitting element according to claim 1, wherein the light transmissive plate comprises indium tin oxide (ITO).

7. The vertical light emitting element according to claim 1, wherein the first electrode pad penetrates the color conversion layer and protrudes beyond the upper surface of the color conversion layer.

8. The vertical light emitting element according to claim 1, wherein the color conversion layer comprises a red light emitting region receiving light from the light emitting semiconductor part to emit red light, a green light emitting region receiving light from the light emitting semiconductor part to emit green light, and a blue light emitting region receiving light from the light emitting semiconductor part to emit blue light; and the red light emitting region, the green light emitting region, and the blue light emitting region are arranged in parallel with one another along the upper surface of the light emitting semiconductor part.

9. The vertical light emitting element according to claim 1, wherein the color conversion layer comprises a red light emitting region and a green light emitting region stacked in a direction perpendicular to the upper surface of the light emitting semiconductor part, the red light emitting region converts blue light or UV light emitted from the light emitting semiconductor part into red light, and the green light emitting region converts blue light or UV light emitted from the light emitting semiconductor part into green light.

10. The vertical light emitting element according to claim 2, wherein the reflective layer is formed on the lower surface of the second conductive semiconductor layer, and the second electrode pad is formed on the lower surface of the reflective layer and is electrically connected to the second conductive semiconductor layer.

11. The vertical light emitting element according to claim 10, wherein the reflective layer comprises a metal reflective layer and a DBR layer.

12. The vertical light emitting element according to claim 10, wherein the reflective layer comprises a metal reflective layer connected to the second conductive semiconductor layer and having an uppers surface and a lower surface opposite to the upper surface of a metal reflective layer, an electrically insulating layer formed on the lower surface of the metal reflective layer, and a via connecting the metal reflective layer to the second electrode pad across the electrically insulating layer.

13. The vertical light emitting element according to claim 1, wherein the light emitting semiconductor part comprises a first vertical light emitting cell having an upper surface and a lower surface opposite to the upper surface of the first vertical light emitting cell, a second vertical light emitting cell having an upper surface and a lower surface opposite to the upper surface of the second vertical light emitting cell, and a third vertical light emitting cell having an upper surface and a lower surface opposite to the upper surface of the second vertical light emitting cell, the first, second, and third vertical light emitting cells being spaced apart from one another; the color conversion electrode part comprises a first color conversion electrode cell formed on the upper surface of the first vertical light emitting cell, a second color conversion electrode cell formed on the upper surface of the second vertical light emitting cell, and a third color conversion electrode cell formed on the upper surface of the third vertical light emitting cell; and the reflective electrode part comprises a first reflective electrode cell formed on the lower surface of the first vertical light emitting cell, a second reflective electrode cell formed on the lower surface of the second vertical light emitting cell, and a third reflective electrode cell formed on the lower surface of the third vertical light emitting cell.

14. The vertical light emitting element according to claim 13, wherein the first color conversion electrode cell comprises a red light emitting region receiving blue light or UV light to emit red light, the second color conversion electrode cell comprises a green light emitting region receiving blue light or UV light to emit green light, and the third color conversion electrode cell comprises a blue light emitting region receiving blue light or UV light to emit blue light.

15. The vertical light emitting element according to claim 13, wherein a light absorber is filled between the first color conversion electrode cell and the second color conversion electrode cell and between the second color conversion electrode cell and the third color conversion electrode cell.

16. The vertical light emitting element according to claim 13, wherein the light transmissive plate is electrically connected individually or in common to first electrode pads disposed in the first color conversion electrode cell, the second color conversion electrode cell, and the third color conversion electrode cell while being in contact with the first color conversion electrode cell, the second color conversion electrode cell, and the third color conversion electrode cell.

* * * * *